United States Patent
Kitagawa et al.

(10) Patent No.: US 9,153,317 B2
(45) Date of Patent: Oct. 6, 2015

(54) NON-VOLATILE MEMORY SYSTEM WITH POWER REDUCTION MECHANISM AND METHOD OF OPERATION THEREOF

(71) Applicant: Sony Corporation, Tokyo (JP)

(72) Inventors: Makoto Kitagawa, Boise, ID (US); Tomohito Tsushima, Tokyo (JP); Takafumi Kunihiro, Tokyo (JP); Jun Sumino, Tokyo (JP); Wataru Otsuka, Boise, ID (US)

(73) Assignee: SONY CORPORATION (JP)

( * ) Notice: Subject to any disclaimer, the term of this patent is extended or adjusted under 35 U.S.C. 154(b) by 153 days.

(21) Appl. No.: 13/724,921

(22) Filed: Dec. 21, 2012

(65) Prior Publication Data

US 2014/0177317 A1    Jun. 26, 2014

(51) Int. Cl.
*G11C 13/00* (2006.01)

(52) U.S. Cl.
CPC ........ *G11C 13/0069* (2013.01); *G11C 13/0064* (2013.01); *G11C 13/0097* (2013.01); *G11C 13/00* (2013.01); *G11C 13/0004* (2013.01); *G11C 2013/0066* (2013.01); *G11C 2013/0092* (2013.01); *G11C 2213/32* (2013.01); *G11C 2213/79* (2013.01)

(58) Field of Classification Search
CPC ............... G11C 13/0069; G11C 13/00; G11C 13/0004; G11C 2013/0092
USPC .................................................. 365/148, 158
See application file for complete search history.

(56) References Cited

U.S. PATENT DOCUMENTS

| | | | |
|---|---|---|---|
| 2012/0014164 A1* | 1/2012 | Kamoshida et al. | 365/148 |
| 2012/0069633 A1* | 3/2012 | Katoh | 365/148 |
| 2012/0147689 A1 | 6/2012 | Scheuerlein et al. | |
| 2012/0163066 A1 | 6/2012 | Maejima | |
| 2012/0166901 A1 | 6/2012 | Kim | |
| 2012/0168706 A1 | 7/2012 | Noh et al. | |
| 2012/0211719 A1 | 8/2012 | Haimoto et al. | |
| 2014/0078811 A1* | 3/2014 | Kawai et al. | 365/148 |

OTHER PUBLICATIONS

Otsuka et al., "A 4Mb Conductive-Bridge Resistive Memory with 2.3GB/s Read-Throughput and 216MB/s Program-Throughput", "Non-Volatile Memory Solutions", 2011, pp. 2021, vol. ISSCC 2011, No. SESSION 11 (11.7), Publisher: IEEE.

* cited by examiner

*Primary Examiner* — Son Dinh
*Assistant Examiner* — Xiaochun L Chen
(74) *Attorney, Agent, or Firm* — Sheridan Ross P.C.

(57) ABSTRACT

A method of operation of a non-volatile memory system including: providing a resistive storage element having a transformation layer; activating a write driver, coupled to the resistive storage element, for applying a bias voltage to the transformation layer; monitoring a resistance of the resistive storage element by a sense amplifier; and detecting a conductive thread, formed in the transformation layer, by the sense amplifier for reducing a level of the bias voltage.

16 Claims, 4 Drawing Sheets

NON-VOLATILE MEMORY SYSTEM WITH POWER REDUCTION MECHANISM AND METHOD OF OPERATION THEREOF

TECHNICAL FIELD

The present invention relates generally to a memory system, and more particularly to a system for managing write processing of individual cells in a non-volatile memory array.

BACKGROUND ART

The performance of non-volatile memory systems has improved over the past several years. Changes in technology management have pushed the non-volatile memory devices into cameras, computers, personal data assistants, smart phones, and proprietary business applications.

The current flash memory devices, based on charge storage technologies, have limited life spans due to damage of the charge storage layers during writes. The damage can be caused by physical weakening of the crystal structure used to store the charge. This condition is countered by limiting the number of writes and reads that an individual memory cell can undergo and balancing writes across all of the locations in the memory. The limited reliability of the cells has given rise to error correction strategies and distributed write operations in order to extend the useable life of the memory modules. Many maintenance processes can operate in background without the knowledge of the operator.

Other non-volatile memory technologies are in development that can increase the useable memory density while extending the lifetime reliability of the memory structures. These non-volatile memory technologies include spin transfer torque random access memory (STT-RAM) and resistive random access memory (R-RAM).

The writing process can require significant power to assure the proper data is captured. The data is captured in the cells by an electro-chemical process that forms ion chains in a semiconductor layer. The reaction time and the resulting resistance of the cell can require significant power for a short period. When many cells are written concurrently, the overall power can be a problem.

While the write of the individual cells can be grouped by a byte or word organization, the erase is performed on a block basis. The block erase can simultaneously erase 4K cells. An issue that has arisen in the new R-RAM technology is that the block erase may have insufficient current to reset all of the individual cells in the erase block. Some percentage of the cells can require additional voltage or current in order to switch states. This condition can be caused by the number of written cells in the erase block and the manufacturing distribution of the individual integrated circuit.

In order to verify that all of the individual cells were properly written, a verify read must be performed in order to determine whether all of the individual cells were actually stored the data correctly. This process can lead to iterative write cycles being used to store all of the data. The iterative write cycles can consume additional power and increase background processing time.

Thus, a need still remains for a non-volatile memory system that can reduce the power consumed during a write process while assuring the data is correctly captured. In view of the exponential growth in the use of non-volatile memory in personal electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

A method of operation of a non-volatile memory system including: providing a resistive storage element having a transformation layer; activating a write driver, coupled to the resistive storage element, for applying a bias voltage to the transformation layer; monitoring a resistance of the resistive storage element by a sense amplifier; and detecting a conductive thread, formed in the transformation layer, by the sense amplifier for reducing a level of the bias voltage.

A non-volatile memory system, including: a resistive storage element having a transformation layer; a write driver, coupled to the resistive storage element, for applying a bias voltage to the transformation layer; a sense amplifier for monitoring a resistance of the resistive storage element; and a conductive thread, formed in the transformation layer, detected by the sense amplifier for reducing a level of the bias voltage.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
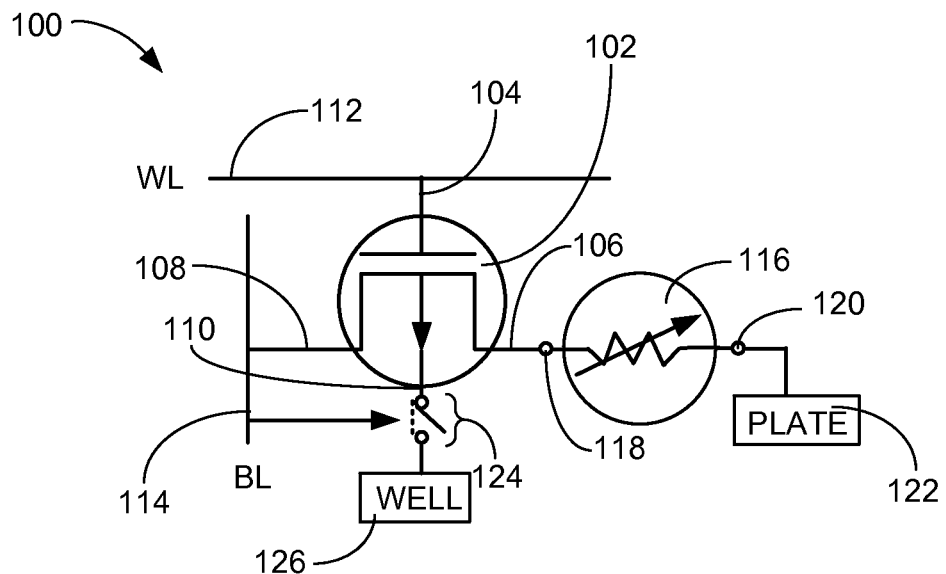
FIG. 1 is a schematic diagram of a portion of a non-volatile memory system with power reduction mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the active surface of the integrated circuit, having the non-volatile memory system, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The phrase "directly on" means that there is direct contact between elements with no intervening elements.

The term "processing" as used herein includes deposition of material or photoresist, patterning, exposure, development, etching, cleaning, and/or removal of the material or photoresist as required in forming a described structure. The phrase "resistive memory" is defined to be a semiconductor structure that is programmable between a low resistance state and a high resistance state, where the high resistance state is at least an order of magnitude higher resistance value than the low resistance state.

Referring now to FIG. 1, therein is shown a schematic diagram of a portion of a non-volatile memory system 100 with power reduction mechanism in an embodiment of the present invention. The schematic diagram of the non-volatile memory system 100 depicts a control field effect transistor 102, such as a P-FET, having a gate electrode 104, a source electrode 106, a drain electrode 108, and a body-tie electrode 110.

A word line 112 can be coupled to the gate electrode 104 of the control field effect transistor 102. It is understood that the word line 112 can be coupled to other instances of the control field effect transistor 102 for forming an array.

A bit line and control bus 114 can be coupled to the drain electrode 108 of the control field effect transistor 102. It is understood that the bit line and control bus 114 can be coupled to other instances of the control field effect transistor 102 that are coupled to a different instance of the word line 112 for forming the array.

A resistive storage element 116 can be coupled to the source electrode 106 of the control field effect transistor 102 through a first electrode 118. The resistive storage element 116 can have a second electrode 120 that is coupled to a plate voltage 122. When programming the resistive storage element 116, the plate voltage can be between 1.0 and 3.5 volts. In order to save power during the write process, the voltage supplied by the bit line and control bus 114 can be reduced. In conjunction with this reduction, the plate voltage 122 can also be reduced and thereby reducing the voltage drop across the non-volatile storage element 116.

A well switch 124 can be coupled between the body-tie electrode 110, of the control field effect transistor 102, and a well voltage 126. During programming and reading operations, the well switch 124 is closed in order to reference the voltage at the source electrode 106 to the well voltage 126. It is understood that the well voltage 126 can reflect the voltage in the well region, in which the control field effect transistor 102 is fabricated. The well voltage 126 can be in the range of 0 to 0.7 volts.

During the reset operation of the non-volatile memory system 100, the well switch 124 can be opened for a period φ and then return to a closed position in order to prevent a latch-up condition in the control field effect transistor 102. During the period φ, with the well switch 124 open, the well voltage 126 can increase from 0 volts due to charge accumulation in the well region.

It is understood that the well switch 124 is shown as a mechanical switch by way of an example only for ease of explanation and the actual implementation will be different. It is further understood that only a single instance of the non-volatile memory system 100 is depicted though more than one can be present in the implementation.

Figure 2:
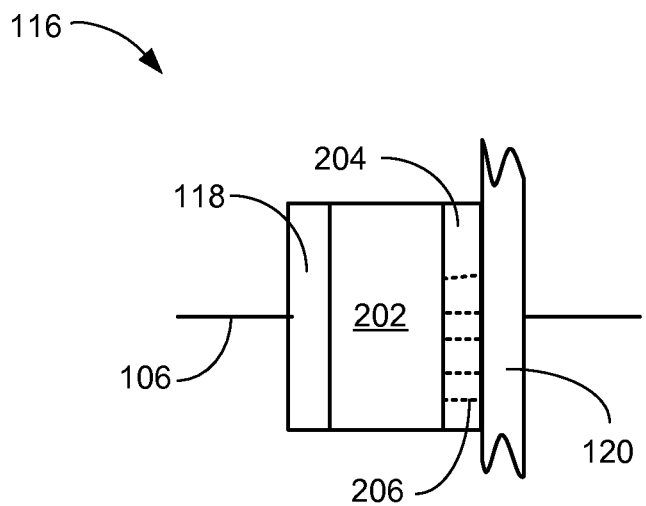
FIG. 2 is a cross-sectional view of the resistive storage element of FIG. 1.

Referring now to FIG. 2, therein is shown a cross-sectional view of the resistive storage element 116 of FIG. 1. The cross-sectional view of the resistive storage element 116 depicts the first electrode 118 in direct contact with a conductive layer 202. The first electrode 118 can be a metal structure formed of nickel (Ni), tin (Sn), copper (Cu) or an alloy of a conductive metal. The conductive layer 202 can be alloys of Tellurium (Te), known as Telluride, such as Copper-Tellurium (CuTe). The first electrode 118 can be coupled directly to the source electrode 106 of the control field effect transistor 102 of FIG. 1.

A transformation layer 204 is in direct contact with the conductive layer 202. The transformation layer 204 can be gadolinium oxide (GdOx) and provides a switching function that can conduct electrons between the conductive layer 202 and the second electrode 120. The transformation layer 204 can be altered by applying a voltage across the first electrode 118 and the second electrode 120. The application of the voltage can cause ions from the conductive layer 202 to migrate into the transformation layer 204 in order to form conductive threads 206 through the transformation layer 204. By reversing the polarity of the voltage across the first electrode 118 and the second electrode 120, the conductive threads 206 can be broken and the ions will migrate back into the conductive layer 202 and returning the transformation layer 204 to its initial state.

The formation of the conductive threads 206, during the write operation, can be monitored to detect when the transition occurs. As the conductive threads are formed the resistance value of the resistive storage element 116 will drop and the current passing through the resistive storage element 116 will increase. This condition can be detected in order to determine the resistive state of the resistive storage element 116.

It has been discovered that the resistive storage element 116 can maintain a resistive state without an electrical supply and can transition between resistive states, by the application of a low voltage direct current signal, with high reliability. Once the conductive threads 206 are formed between the conductive layer 202 and the second electrode 120, they will remain in place until they are forced to break down by applying a similar voltage level in a reverse direction.

It is understood that the method of fabrication of the resistive storage element 116 can be in a different orientation than what is shown. The first electrode 118 and the second electrode 120 can be coupled to interconnect layers for incorporation into switching and monitoring circuits.

Figure 3:
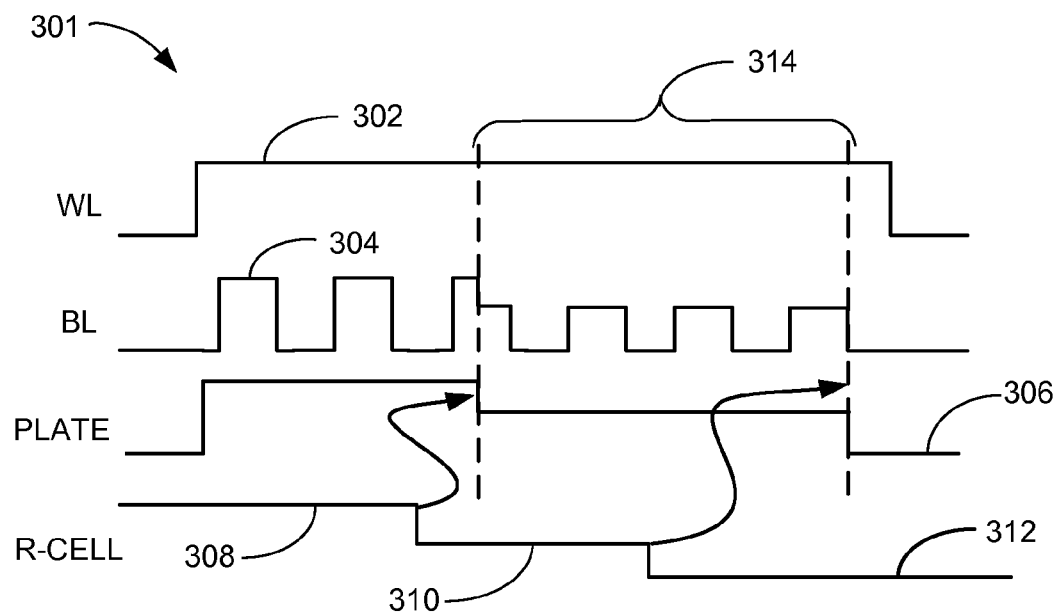
FIG. 3 is a timing diagram of the operation of the non-volatile memory system of FIG. 1.

Referring now to FIG. 3, therein is shown a timing diagram 301 of the operation of the non-volatile memory system 100 of FIG. 1. The timing diagram 301 depicts a word line signal 302 that can transition between 0.1V and greater than 2.0V in preparation for initiating an operation, including a write, read, or reset, of the resistive storage element 116 of FIG. 1. During a write process of the resistive storage element 116, all of the resistive storage element 116 that are selected by the word line 112 of FIG. 1 and the bit line and control bus 114 of FIG. 1 are accessed concurrently. In this instance multiple of the word line 112 can be activated concurrently. A word line signal 302 can show the address and control timing for a specific instance of the resistive storage element 116.

A bit line signal 304 can transition between 0.1V and greater than 2.0V. The bit line signal 304 can be asserted for the specific instance of the resistive storage element 116 and each of the resistive storage element 116 so selected can be written concurrently. The bit line signal 304 can provide a modulation that can protect the transformation layer 204 of FIG. 2. The modulation can limit the amount of time that voltage is applied across the resistive storage element 116.

A plate voltage signal 306 can transition from 0V to a voltage greater than 2.0V in order to provide a path for electrons (not shown) from the source electrode 106 of FIG. 1 to propagate through the resistive storage element 116. The application of a voltage across the resistive storage element 116 can modify the transformation layer 204 of FIG. 2. During a write operation, a selected instance of the resistive storage element 116 can be biased appropriately to form the conductive threads 206 of FIG. 2.

If the initial state of the resistive storage element 116 is in the high resistance state 308, the application of voltage across the resistive storage element 116 can start to form the conductive threads 206 required to change the resistive state. When the level of the bit line signal 304 and the plate voltage signal 306 are the same level there is no voltage difference across the resistive storage element 116 and no current will flow. When the bit line signal is reduced to 0V for a period of time, the full voltage difference is dropped across the resistive storage element 116. The assertion of current through the resistive storage element 116 can be limited to less than 16 ηS in order to prevent a rupture of the transformation layer 204. This process can allow the ions from the conductive layer 202 of FIG. 2 to migrate into a chain that will eventually form the conductive threads 206.

A transition between the high resistance state 308 and a weak-low resistive state 310, indicates that the conductive threads are starting to increase in number. At this transition the change in current through the resistive storage element 116 can be detected. In response to the transition, the plate voltage signal 306 and the bit line signal 304 can be reduced in voltage.

By way of en example, the elevated voltage of the plate voltage signal 306 and the bit line signal can be 2.5V. When both signals are high there is no voltage dropped across the resistive storage element 116. When the bit line signal 304 switches to 0V, the resistive storage element 116 is subjected to a full 2.5V across the resistive storage element 116. At the transition between the high resistance state 308 and the weak-low resistance state 310, the voltage on the plate voltage signal 306 and the bit line signal 304 can be reduced to 1.5V with a resultant 0V across the resistive storage element 116. The transition of the bit line signal 304 to 0V will then subject the resistive storage element 116 to a 1.5V signal.

It has been discovered that the reduction of the voltage level of the plate voltage signal 306 and the bit line signal 304 can reduce the power consumed during a write process. The accumulated power savings can represent up to a 30% reduction in the power consumed by the writing of the resistive storage element 116.

The reduced current that is applied to the resistive storage element 116 can still cause a transition from the weak-low resistance state 310 to a low resistance state 312. The switching from the weak-low resistance state 310 to the low resistance state 312 indicates that the resistance of the resistive storage element 116 has dropped below a threshold that can provide at least an order of magnitude difference in the resistance value between the high resistance state 308 and the low resistance state 312. The operational write can require up to 30% less power during a reduced voltage write 314 that can only occur due to the monitoring of the transition between the high resistive state 308 and the weak-low resistive state 310 followed by the transition between the weak-low resistance state 310 to the low resistance state 312.

It is understood that the timing diagram 301 is indicated to explain the operation of a single instance of the non-volatile memory system 100 and the actual signals, while writing a selected set of the resistive storage element 116, will differ.

It has been discovered that the monitoring of the transition from the high resistive state 308 to the weak-low resistive state 310 can trigger a reduction in applied voltage in order to reduce the power consumption by up to 30%. The resultant effect can increase the reliability and extend the useful life of the non-volatile storage system 100.

Figure 4:
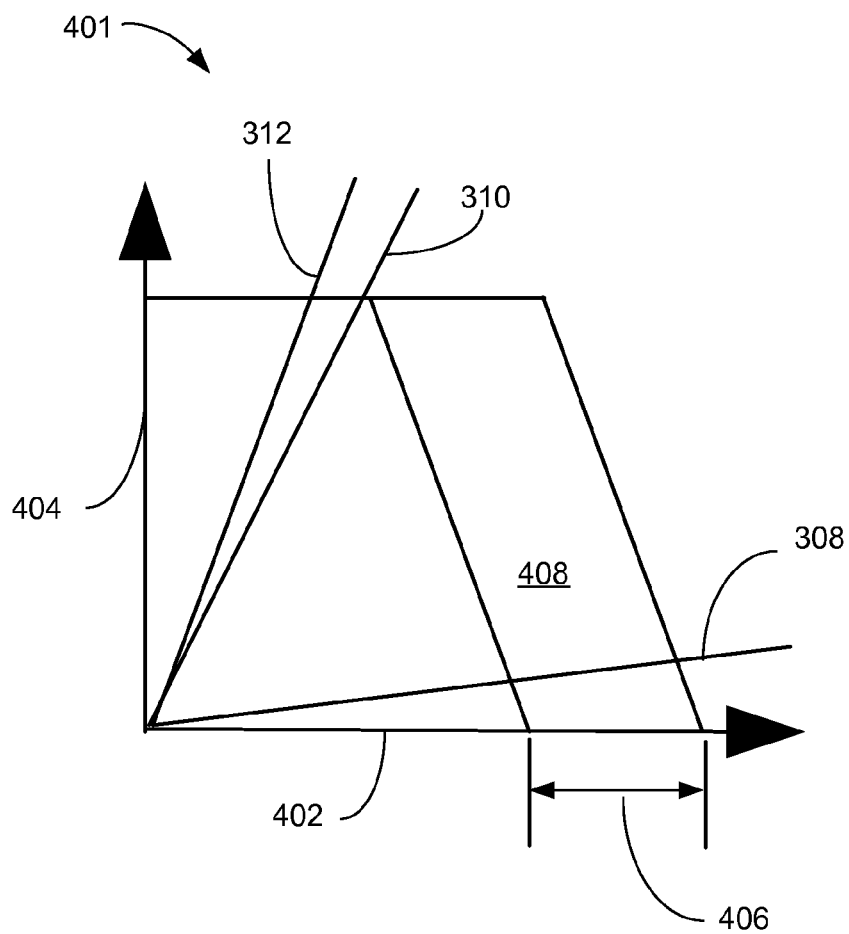
FIG. 4 is a line graph of a resistive characteristic of an exemplary cell of the non-volatile memory system of FIG. 1

Referring now to FIG. 4, therein is shown a line graph of a resistive characteristic 401 of an exemplary cell of the non-volatile memory system 100 of FIG. 1. The line graph of the resistive characteristic 401 depicts a Cartesian coordinate system having a first electrode voltage 402 on the X-axis and a reset current 404 on the Y-axis. A straight-line estimation of the high resistance state 308 of the resistive storage element 116 of FIG. 1 is plotted in the first quadrant. A straight-line estimation of weak-low resistance state 310 and the low resistance state 312 of the resistive storage element 116 are plotted in the first quadrant also. There is approximately an order of magnitude difference in the resistance values between the low resistance state 314 and the high resistance state 316.

A reduced voltage 406 can represent the reduced voltage provided to the resistive storage element 116 as a result of detecting the transition from the high resistive state 308 to the weak-low resistive state 310. The area within a reduced power region 408 represents the reduction in power realized by reducing the voltage across the resistive storage element 116 of FIG. 1.

It has been discovered that the reduced voltage 406 provided by reducing the voltage across the resistive storage element 116 after the transition from the high resistance state 308 to the weak-low resistance state 310 can significantly reduce the power required to write data to the non-volatile storage system 100.

Figure 5:
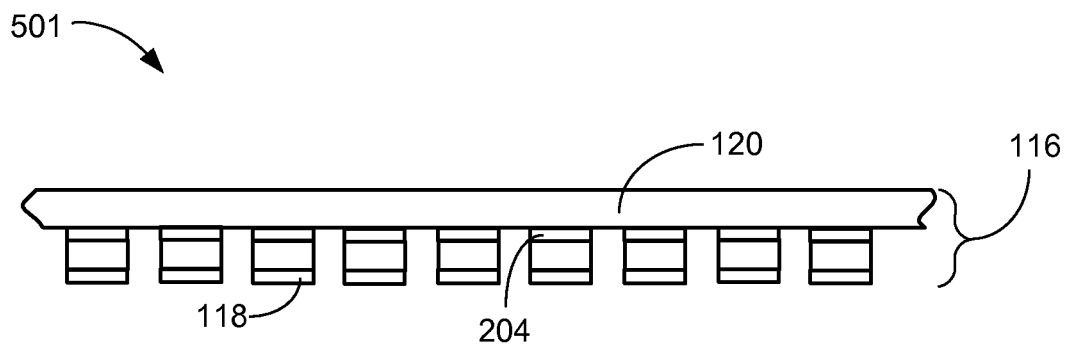
FIG. 5 is a cross-sectional view of an array of the resistive storage element of FIG. 1.

Referring now to FIG. 5, therein is shown a cross-sectional view of an array 501 of the resistive storage element 100 of FIG. 1. The cross-sectional view of the array 501 depicts the resistive storage element 116. The second electrode 120 can extend over a number of the transformation layer 204. Each of the resistive storage element 116 can have a separate first electrode 118.

During the writing process, the second electrode 120 is set to the plate voltage signal 306 and each of the first electrode 118 is elevated to the bit line signal 304. The resulting voltage drop is applied between the first electrode 118 and the second electrode 120. It is understood that the addressing of the individual instances of the resistive storage element 116 is determined by the word line 112 of FIG. 1 and the bit line and control bus 114 of FIG. 1 that enable the control field effect transistor 102 of FIG. 1. The control field effect transistor 102 can deliver the reduced voltage because it is operating in saturation and will pass the reduced voltage provided through the bit line and control bus 114 of FIG. 1.

Figure 6:
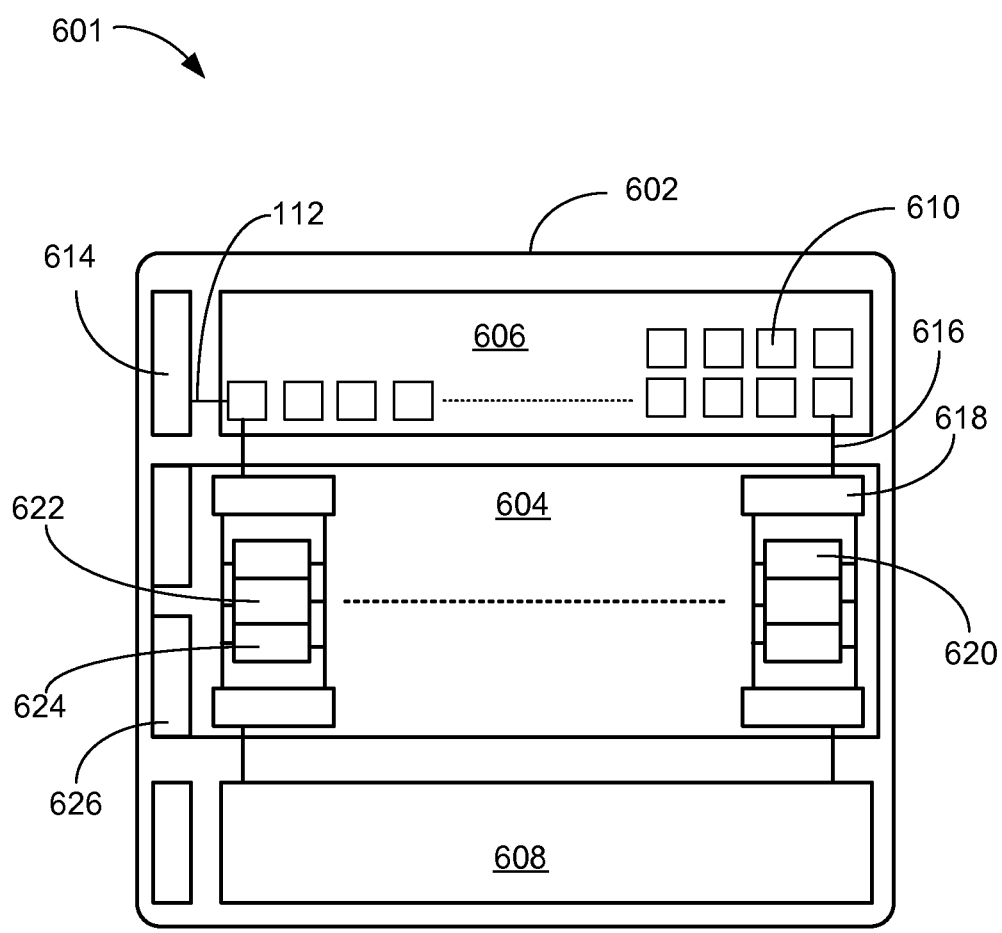
FIG. 6 is a block diagram of a non-volatile memory device having the non-volatile memory system of FIG. 1.

Referring now to FIG. 6, therein is shown a block diagram of a non-volatile memory device 601 having the non-volatile memory system 100 of FIG. 1. The block diagram of the non-volatile memory device 601 depicts an integrated circuit die 602 having a control block 604 positioned between a first memory array 606 and a second memory array 608. The first memory array 606 and the second memory array 608 include the non-volatile memory cells 610 as well as the interconnect layers 112.

A word line driver 614 can be positioned adjacent to the first memory array 606 and the second memory array 608. The word line driver 614 can control the word line address on the interconnect layers 112. The word line driver 614 can coordinate the addressing of blocks or individual instances of the non-volatile memory cells 610 with the assistance of the control block 604.

The control block 604 can propagate a bit line and control bus 616 in coordination with the word line driver 614 in order to address the non-volatile memory cells 610 within the first memory array 606 and the second memory array 608. The bit line and control bus 616 can select and control the individual instances of the non-volatile memory cells 610. The control block 604 has several instances of an analog multiplexer 618. The analog multiplexer 618 can propagate signals in two directions concurrently.

A read reference generator 620, coupled to the analog multiplexer 618, can provide bias voltages for the non-volatile memory cells 610 during reset verification and reading processes. A write driver 622 can be coupled to the analog multiplexer 618 for conditioning selected of the non-volatile memory cells 610 during write operations. A sense amplifier 624 can be coupled to the analog multiplexer 618 for monitoring transitions of the resistive state of the non-volatile memory cells 610.

The write driver 622 can manipulate the bit line and control bus 616 in order to reduce the first electrode voltage 402 of FIG. 4 when the sense amplifier 624 detects an initial transition from the high resistance state 308 of FIG. 3 to the weak low resistance state 310 of FIG. 3. Since the control field effect transistor 102 of FIG. 1 is operating in saturation, the reduction in the first electrode voltage 402 can reflect a reduction in power consumed by the non-volatile memory system 100 of FIG. 1 during the operation.

A plate voltage driver 626 can establish the voltage reference while writing, resetting, or reading. The plate voltage driver 626 can work with the write driver 622 and the sense amplifier 624 in order to manipulate the plate voltage signal 306 of FIG. 3 during the write operation in order to further reduce the amount of power consumed by the write operation. The write driver 622 can reduce the voltage provided through the bit line and control bus 616 to allow the bit line signal 304 of FIG. 3 to match the level of the plate voltage signal 306.

The plate voltage driver 626 can manage several concurrent processes. The geometry of the first memory array 606 and the second memory array 608 can interleave write processes, reset processes, and read processes. The concurrent processes can be allocated to different regions of the first memory array 606 and the second memory array 608.

It has been discovered that the non-volatile memory device 601 can provide a highly reliable, manufacturable, and good yielding integrated circuit solution for high capacity and long term non-volatile memory applications. The non-volatile memory cells 610 are highly manufacturable and their manipulation by the control block 604 provides extra margin to the operation of the non-volatile memory device 601. The non-volatile memory system 100 can be fabricated in complementary metal oxide semiconductor (CMOS) processes, such as 180 ηm CMOS technology.

It has further been discovered that the reduction in power provided by the non-volatile memory system 100 can significantly reduce the power consumption of the non-volatile memory device 601, thereby increasing the reliability.

It is understood that the display of the non-volatile memory cells 610 is an example only and a different number and configuration of the non-volatile memory cells 610 is likely. It is further understood that the configuration of the first memory array 606 and the second memory array 608 can be the same in order to provide distributed and balanced processing across the non-volatile memory device 601.

Figure 7:
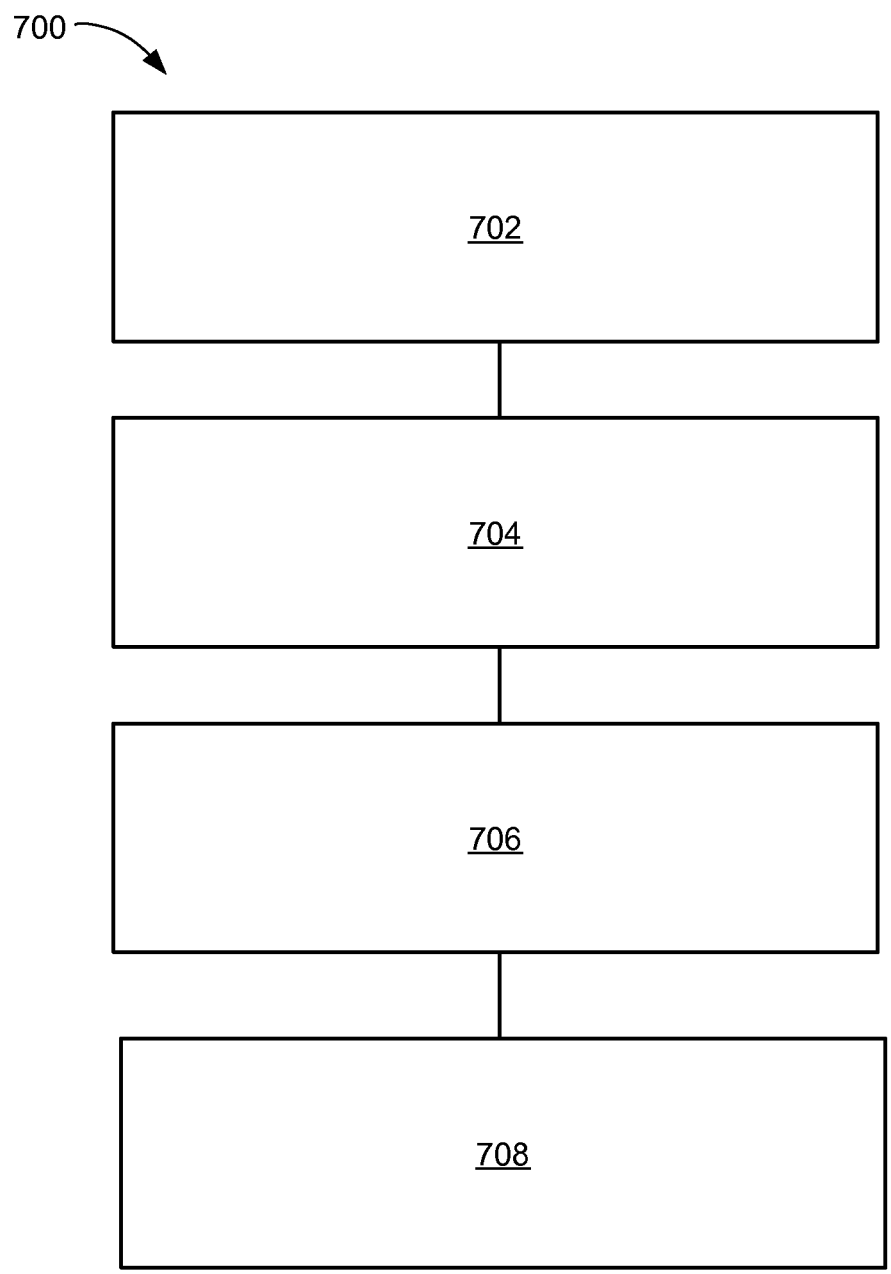
FIG. 7 is a flow chart of a method of operation of a non-volatile memory system in a further embodiment of the present invention.

Referring now to FIG. 7, therein is shown a flow chart of a method 700 of operation of a non-volatile memory system in a further embodiment of the present invention. The method 700 includes: providing a resistive storage element having a transformation layer in a block 702; activating a write driver, coupled to the resistive storage element, for applying a bias voltage to the transformation layer in a block 704; monitoring a resistance of the resistive storage element by a sense amplifier in a block 706; and detecting a conductive thread, formed in the transformation layer, by the sense amplifier for reducing a level of the bias voltage in a block 708.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a non-volatile memory system comprising:
   providing a resistive storage element having a transformation layer;
   adjusting a plate voltage driver, coupled to a second electrode of the resistive storage element, for providing a reduced voltage including adjusting a bit line and control bus to the same voltage as the plate voltage driver;
   activating a write driver, coupled to the resistive storage element, for applying a bias voltage to the transformation layer;
   monitoring a resistance of the resistive storage element by a sense amplifier; and
   detecting a conductive thread, formed in the transformation layer, by the sense amplifier for reducing a level of the bias voltage.

2. The method as claimed in claim 1 wherein detecting the conductive thread includes monitoring a high resistance state transitioning to a weak-low resistive state, by the sense amplifier.

3. The method as claimed in claim 1 wherein activating the write driver includes:
   selecting a control field effect transistor coupled to the resistive storage element; and
   driving the bit line and control bus coupled to the control field effect transistor.

4. The method as claimed in claim 1 further comprising operating a control field effect transistor in a saturation mode for selecting the resistive storage element.

5. A method of operation of a non-volatile memory system comprising:
   providing a resistive storage element having a transformation layer including forming a conductive layer directly on the transformation layer;
   adjusting a plate voltage drive to a second electrode of the resistive storage element, for providing a reduced voltage including adjusting a bit line and control bus to the same voltage as the plate voltage driver,
   activating a write driver, coupled to the resistive storage element, for applying a bias voltage to the transformation layer including modulating a bit line and control bus for protecting the transformation layer;
   monitoring a resistance of the resistive storage element by a sense amplifier including sampling an analog multiplexer for determining the resistance; and
   detecting a conductive thread, formed in the transformation layer, by the sense amplifier for reducing a level of the bias voltage including reducing a power consumption by up to 30%.

6. The method as claimed in claim 5 wherein detecting the conductive thread includes monitoring, a high resistance state transitioning to a weak-low resistive state, by the sense amplifier including sampling an analog multiplexer by the sense amplifier.

7. The method as claimed in claim 5 wherein activating the write driver includes:
   selecting a control field effect transistor coupled to the resistive storage element including activating a word line coupled to the control field effect transistor; and
   driving the bit line and control bus coupled to the control field effect transistor including driving a source electrode for applying the bias voltage to the resistive storage element.

8. The method as claimed in claim 5 further comprising operating a control field effect transistor in a saturation mode for selecting the resistive storage element including lowering a bit line signal voltage in response to the resistive storage element transitioning from a high resistance state to a weak-low resistive state.

9. A non-volatile memory system comprising:
   a resistive storage element having a transformation layer;
   a plate voltage driver, coupled to a second electrode of the resistive storage element, adjusted for providing a reduced voltage including a bit line and control bus adjusted to the same voltage as the plate voltage driver;
   a write driver, coupled to the resistive storage element, for applying a bias voltage to the transformation layer;
   a sense amplifier for monitoring a resistance of the resistive storage element; and
   a conductive thread, formed in the transformation layer, detected by the sense amplifier for reducing a level of the bias voltage.

10. The system as claimed in claim 9 wherein the conductive thread detected includes a high resistance state switched to a weak-low resistive state, monitored by the sense amplifier.

11. The system as claimed in claim 9 wherein the write driver activated includes:
   a control field effect transistor coupled to the resistive storage element selected; and
   the bit line and control bus coupled to the control field effect transistor for applying the bias voltage.

12. The system as claimed in claim 9 further comprising a control field effect transistor operated in a saturation mode for selecting the resistive storage element.

13. The system as claimed in claim 9 further comprising:
   a conductive layer formed directly on the transformation layer;
   the bit line and control bus modulated for protecting the transformation layer;
   an analog multiplexer for determining the resistance; and
   a power consumption reduces by up to 30%.

14. The system as claimed in claim 13 wherein the conductive thread detected includes a high resistance state transitioned to a weak-low resistive state monitored by the sense amplifier includes an analog multiplexer sampled by the sense amplifier.

15. The system as claimed in claim 13 wherein the write driver activated includes:
   a control field effect transistor coupled to the resistive storage element selected includes a word line, coupled to the control field effect transistor, activated; and
   the bit line and control bus, coupled to the control field effect transistor, driven includes a source electrode for applying the bias voltage to the resistive storage element.

16. The system as claimed in claim 13 further comprising a control field effect transistor operated in a saturation mode for selecting the resistive storage element includes a bit line signal voltage lowered in response to the resistive storage element switched from a high resistance state to a weak-low resistive state.

* * * * *